(12) United States Patent
Uhov

(10) Patent No.: US 8,030,950 B2
(45) Date of Patent: Oct. 4, 2011

(54) METHOD AND DEVICE FOR MEASURING THE CAPACITANCE OF A CAPACITIVE COMPONENT

(75) Inventor: Andrei Uhov, St. Petersburg (RU)

(73) Assignee: Electrolux Home Products Corporation N.V., Zaventem (BE)

( * ) Notice: Subject to any disclaimer, the term of this patent is extended or adjusted under 35 U.S.C. 154(b) by 399 days.

(21) Appl. No.: 12/303,202

(22) PCT Filed: May 25, 2007

(86) PCT No.: PCT/EP2007/004681
§ 371 (c)(1),
(2), (4) Date: Dec. 17, 2008

(87) PCT Pub. No.: WO2007/137786
PCT Pub. Date: Dec. 6, 2007

(65) Prior Publication Data
US 2009/0235738 A1 Sep. 24, 2009

(51) Int. Cl.
*G01R 27/26* (2006.01)
(52) U.S. Cl. ......... 324/676; 324/679; 324/681; 324/689
(58) Field of Classification Search .................. None
See application file for complete search history.

(56) References Cited

U.S. PATENT DOCUMENTS

| | | | | |
|---|---|---|---|---|
| 4,199,984 | A | * | 4/1980 | Huddart et al. ............. 73/304 C |
| 4,204,427 | A | * | 5/1980 | Gothe et al. ............... 73/304 C |
| 4,444,051 | A | * | 4/1984 | Yamaki et al. ............. 73/304 C |
| 4,589,077 | A | * | 5/1986 | Pope ............................. 702/52 |
| 4,642,555 | A | | 2/1987 | Swartz et al. |
| 2002/0008526 | A1 | | 1/2002 | Martin et al. |

FOREIGN PATENT DOCUMENTS

| | | |
|---|---|---|
| DE | 29916989 U1 | 4/2000 |
| DE | 10023850 | 11/2001 |
| FR | 2383436 | 10/1978 |

OTHER PUBLICATIONS

International Search Report for PCT/EP2007/004681, dated Aug. 21, 2007, 2 pages.
European Office action for application No. 06114827.6 dated Oct. 30, 2009.

* cited by examiner

*Primary Examiner* — Minh N Tang
(74) *Attorney, Agent, or Firm* — Pearne & Gordon LLP

(57) ABSTRACT

A method of measuring the capacitance of a capacitive component (21), whereby a digital bridge with two measuring branches generates a first signal ($B_1$) defined by a train of measuring pulses (M) having a frequency ($f_1$) related to the unknown capacitance being measured, and a second signal ($B_2$) defined by a train of reference pulses (L) having a frequency ($f_2$) related to a reference capacitance ($C_{REF}$) of known value. The time difference ($\Delta T$) between the times (T1, T2) taken by the two measuring branches of the digital bridge to generate an equal number of pulses ($Th_1$, $Th_2$) is calculated. The capacitance difference ($\Delta C$) between the unknown capacitance and the reference capacitance ($C_{REF}$) is determined as a function of the time difference ($\Delta T$). The unknown capacitance of the capacitive component (21) is calculated on the basis of the reference capacitance ($C_{REF}$) and the capacitance difference ($\Delta C$).

20 Claims, 5 Drawing Sheets

US 8,030,950 B2

METHOD AND DEVICE FOR MEASURING THE CAPACITANCE OF A CAPACITIVE COMPONENT

BACKGROUND OF THE INVENTION

The present invention relates to a method and device for measuring the capacitance of a capacitive component.

More specifically, the present invention relates to a method and device for accurately determining the capacitance of a capacitive component varying as a function of a physical quantity, such as the amount of liquid in a vessel; to which the following description refers purely by way of example.

As is known, some electronic devices currently used to determine the amount of liquid in a vessel or the pressing of a key employ a capacitive component varying in capacitance as a function of the quantity to be determined; and a measuring device connected to the capacitive component to measure its capacitance and provide a quantitative indication of the physical quantity causing the variation in capacitance.

Some measuring devices used for the above purposes are of digital circuit architecture, wherein a multivibrator stage is connected to the capacitive component to oscillate and generate a train of pulses frequency-related to the capacitance of the capacitive component. The multivibrator stage is also connected to a counter stage, which counts the pulses generated by the multivibrator stage and supplies an interrupt signal when the pulse count, as of a start instant in which a reset signal is received, reaches a predetermined count threshold.

The reset signal and interrupt signal are generated/received by a microprocessor with an internal clock for measuring the time interval between the instant the reset signal is generated and the instant the interrupt signal is received, and on the basis of which the capacitance of the capacitive component is determined.

By way of a non-limiting example, FIG. 1 shows a measuring device 1 of digital architecture as described above, and for measuring the capacitance of a capacitive component 4 defined, for example, by a capacitor. The capacitor comprises a first plate, and a second plate polarized to a ground potential $V_{GND}$; and the first and second plate respectively define a measuring electrode 4a and a reference electrode 4b of measuring device 1, which are typically located in a vessel to determine a liquid level.

More specifically, measuring device 1 substantially comprises a microprocessor processing unit 2, which generates a reset signal R synchronized with the instant an internal clock 2a is activated, and which receives an interrupt signal I to stop the clock; and a pulse generating circuit 3, in turn comprising a multivibrator stage 5 and a counter stage 6.

More specifically, multivibrator stage 5 has a terminal 5a receiving reset signal R; a terminal 5b connected to measuring electrode 4a; a terminal 5c connected to reference electrode 4b; and an output 5d which generates a switching signal B defined by a train of rectangular pulses D frequency-related to the capacitance of capacitive component 4, as shown in FIG. 2.

More specifically, multivibrator stage 5 is typically defined by a Schmitt trigger, and counter stage 6 has a terminal 6a which receives reset signal R to start the count of pulses D; a terminal 6b which receives the train of pulses D; and a terminal 6c which generates interrupt signal I when the number of pulses D reaches a predetermined trigger threshold Th.

With reference to FIG. 2, the capacitance of capacitor 4 is measured by measuring device 1 at predetermined time intervals TI, each started by the microprocessor generating reset signal R.

During each time interval TI, microprocessor 2 activates the clock and, at the same time, supplies reset signal R to multivibrator stage 5 and counter stage 6.

More specifically, reset signal R is received as a trigger pulse by multivibrator stage 5, which switches from a rest condition to an oscillating condition (point P in FIG. 2) in which multivibrator stage 5 generates pulses D with a frequency proportional to the capacitance of capacitive component 4.

Reset signal R also starts the count of pulses D by counter stage 6.

As long as the pulse D count is below predetermined trigger threshold Th, interrupt signal I switches to a first, e.g. high, logic level. Conversely, when the pulse D count equals predetermined trigger threshold Th (point E in FIG. 2), interrupt signal I switches to a second—in this case, low—logic level to stop the pulse count. At this point, microprocessor 2 determines the time interval TA between the start and end of the pulse D count, and accordingly calculates the capacitance value.

BRIEF SUMMARY

Measuring devices of the above type perform particularly well when measuring large variations in capacitance, but not so well in the case of small variations.

It is an object of the present invention to provide a device and method for measuring the capacitance of a capacitive component to a greater degree of precision than that of known devices.

According to the present invention, there are provided a device and method for measuring the capacitance of a capacitive component, as defined in the accompanying Claims.

BRIEF DESCRIPTION OF THE DRAWINGS

A non-limiting embodiment of the present invention will be described by way of example with reference to the accompanying drawings, in which.

DETAILED DESCRIPTION

The present invention is substantially based on the principle of:

generating, by means of a digital bridge with two measuring branches, a first signal defined by a train of pulses frequency-related to the unknown capacitance to be determined, and a second signal defined by a train of pulses frequency-related to a reference capacitance of known value;

calculating the difference in the times taken by the two measuring branches of the digital bridge to generate an equal number of pulses:

determining the difference between the unknown capacitance and the reference capacitance as a function of the difference in the times taken by the two measuring branches of the digital bridge to generate an equal number of pulses; and calculating the unknown capacitance on the basis of the reference capacitance and the above calculated difference.

Figure 3:
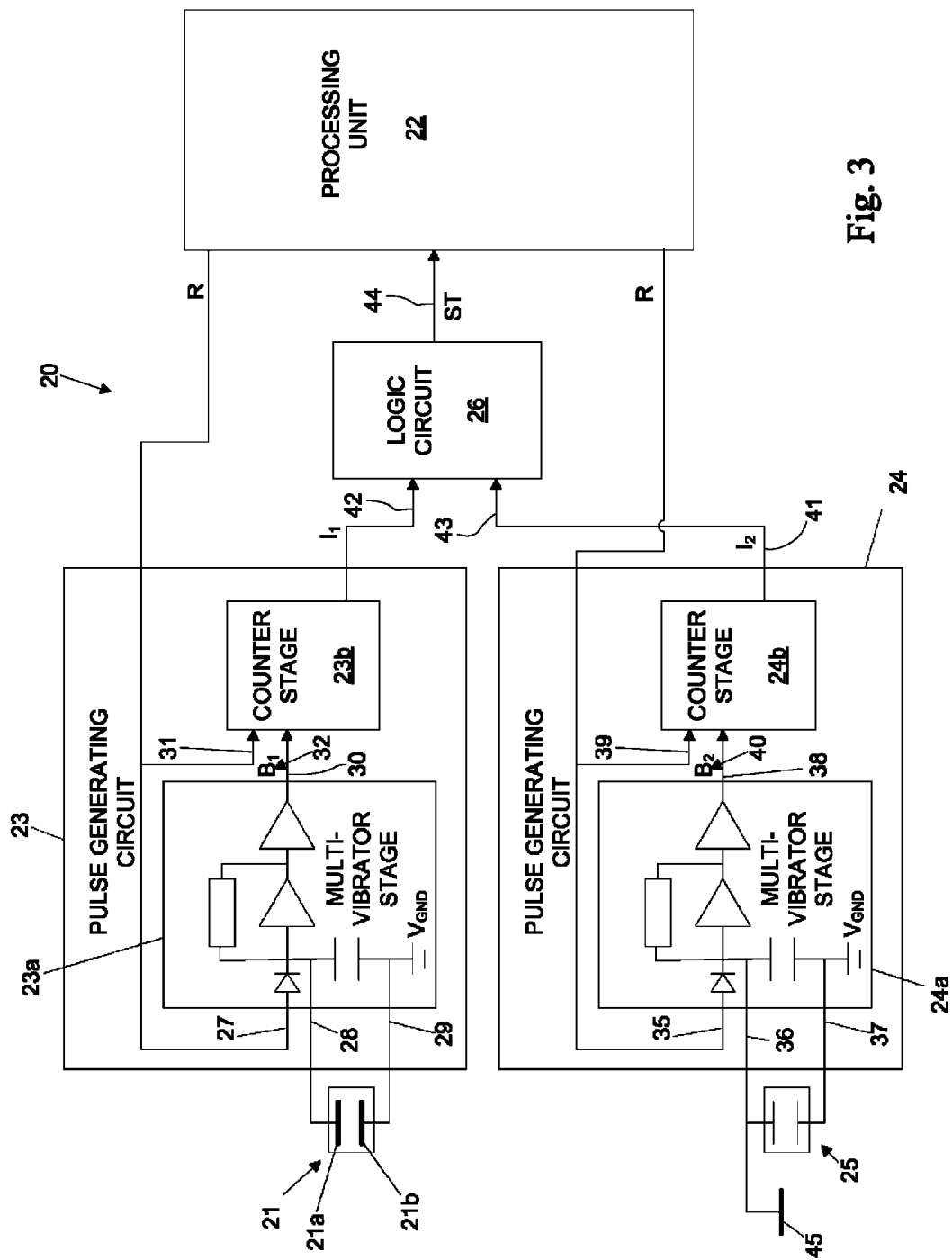
FIG. 3 shows a block diagram of a capacitance measuring device in accordance with the present invention.

FIG. 3 shows a block diagram of a measuring device 20 for measuring the capacitance of a capacitive component in accordance with the present invention.

More specifically, in the FIG. 3 embodiment, the capacitive component 21 has a first plate, and a second plate polarized to a reference potential, preferably but not necessarily a ground potential $V_{GND}$; and the first and second plate respectively define a measuring electrode 21a and a reference electrode 21b of measuring device 20.

Measuring device 20 substantially comprises a pulse generating circuit 23, to which is connected the capacitive component 21 whose capacitance is to be determined; a pulse generating circuit 24, to which is connected a reference capacitive component 25, e.g. a capacitor having a reference capacitance $C_{REF}$ of known constant value; a logic circuit 26 for generating a logic signal, which assumes a logic level for a time related, in particular, proportional, to the difference $\Delta C$ between reference capacitance $C_{REF}$ and the unknown capacitance being measured, as described in detail below; and a processing unit 22 configured to determine the unknown capacitance being measured, as a function of difference $\Delta C$ and the value of reference capacitance $C_{REF}$.

Figure 1:
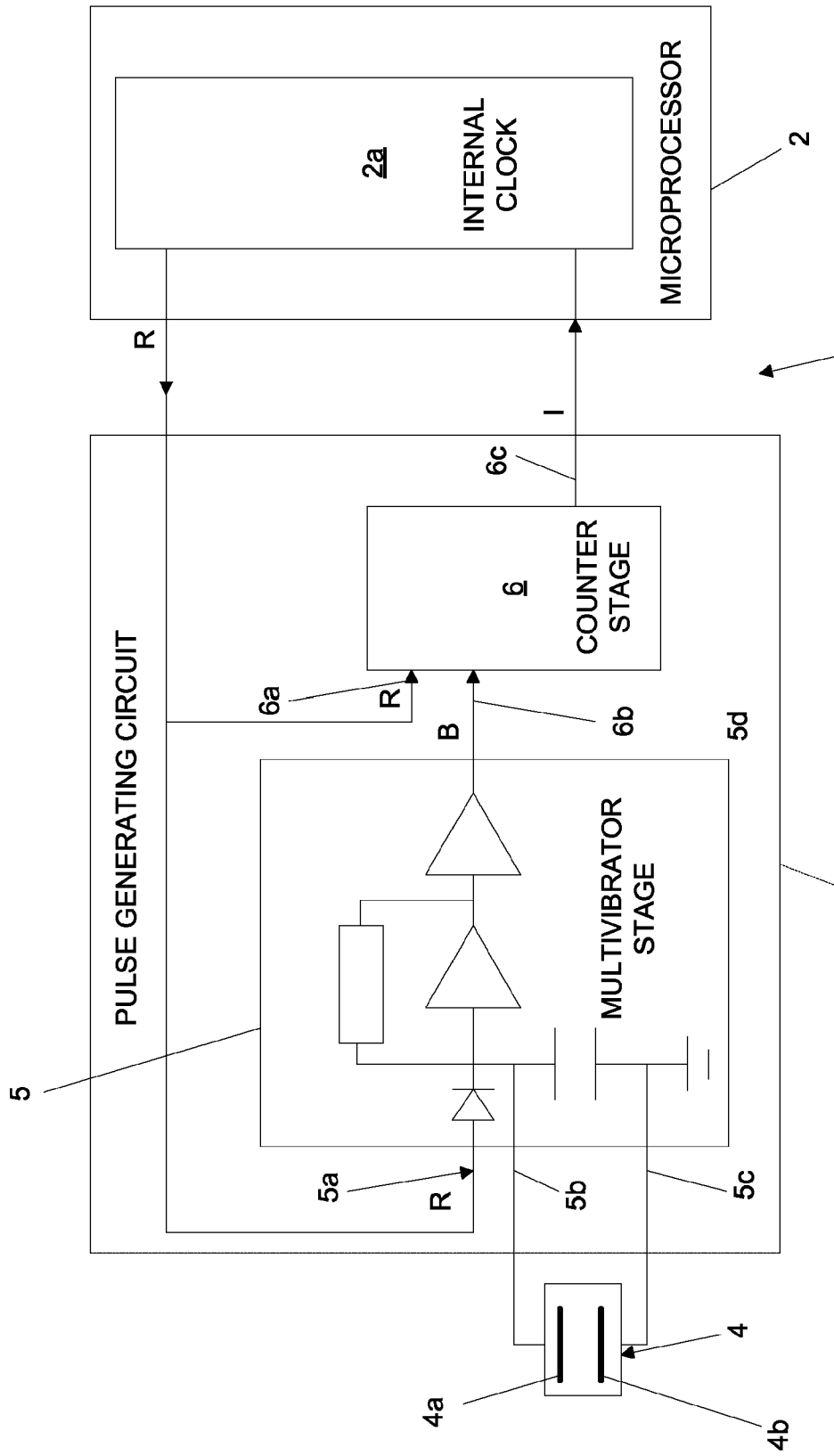
FIG. 1 shows a block diagram of a known device for measuring the capacitance of a capacitive component.
Figure 2:
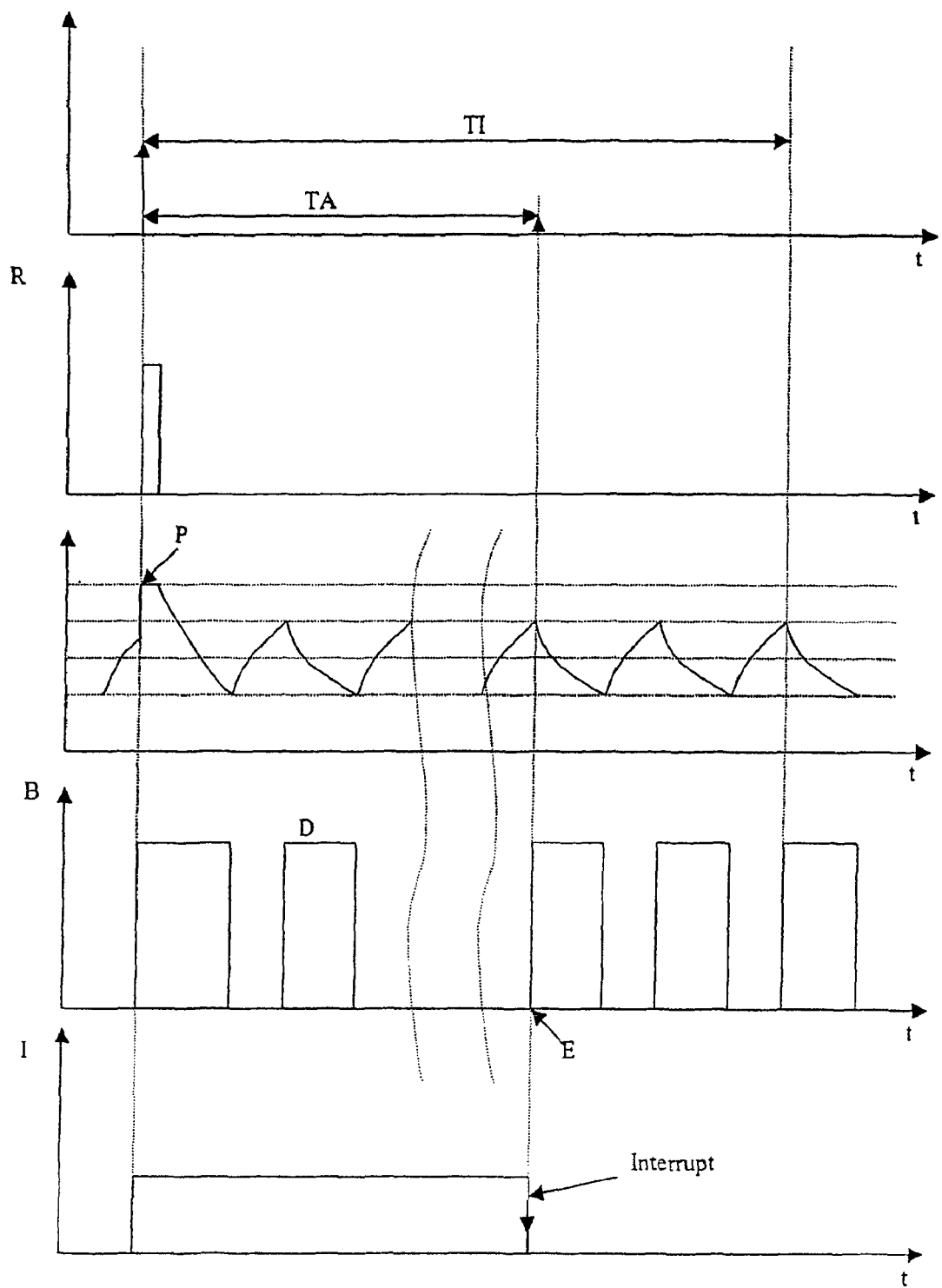
FIG. 2 shows a time graph of signals generated by the FIG. 1 capacitance measuring device.

More specifically, in the FIG. 3 example, pulse generating circuits 23 and 24 are both of the same digital architecture as pulse generating circuit 3 in FIG. 1, i.e. each comprise a multivibrator stage and a counter stage.

More specifically, pulse generating circuit 23 comprises a multivibrator stage 23a, preferably, though not necessarily, defined by a Schmitt trigger or any other similar multivibrator circuit, e.g. bistable multivibrator, which has an input terminal 27 receiving a reset signal R; a first and second input terminal 28, 29 connected respectively to measuring electrode 21a and reference electrode 21b of capacitive component 21; and an output terminal 30 which supplies a switching signal $B_1$ defined by a train of measuring pulses M having a frequency $f_1$ related to the capacitance of capacitive component 21.

Pulse generating circuit 23 also comprises a counter stage 23b, in turn comprising an input terminal 31 receiving reset signal R, which also starts the count of measuring pulses M by counter stage 23b; an input terminal 32 receiving switching signal $B_1$; and an output terminal 33 supplying an interrupt signal $I_1$.

As long as the measuring pulse M count is below a predetermined first trigger threshold $Th_1$, counter stage 23b switches interrupt signal $I_1$ to a first, e.g. high, logic level. Conversely, when the measuring pulse M count equals predetermined trigger threshold $Th_1$ (point F in FIG. 4), counter stage 23b switches interrupt signal $I_1$ to a second—in this case, low—logic level to stop the measuring pulse M count.

Pulse generating circuit 24 comprises a multivibrator stage 24a, preferably, though not necessarily, defined by a Schmitt trigger or any other similar multivibrator circuit, e.g. bistable multivibrator, which has an input terminal 35 receiving a reset signal R; a first and second input terminal 36, 37 connected respectively to a first and second terminal of reference capacitive component 25; and an output terminal 38 which supplies a switching signal $B_2$ defined by a train of reference pulses L having a frequency $f_2$ related to the reference capacitance $C_{REF}$ of reference capacitive component 25.

Pulse generating circuit 24 also comprises a counter stage 24b, in turn comprising an input terminal 39 receiving reset signal R, which also starts the count of reference pulses L by counter stage 24b; an input terminal 40 receiving switching signal $B_2$; and an output terminal 41 supplying an interrupt signal $I_2$.

As long as the reference pulse L count is below a predetermined second trigger threshold $Th_2$ (e.g. $Th_2=Th_1$), counter stage 24b switches interrupt signal $I_2$ to a first, e.g. high, logic level. Conversely, when the reference pulse L count equals predetermined trigger threshold $Th_2$ (point U in FIG. 4), counter stage 24b switches interrupt signal $I_2$ to a second—in this case, low—logic level to stop the reference pulse L count.

Logic circuit 26 comprises a first and second input terminal 42, 43 receiving interrupt signals $I_1$, $I_2$ respectively; and an output terminal 44 generating the logic signal ST, which assumes a first, e.g. low, logic level when both interrupt signals $I_1$ and $I_2$ are at the same logic level, and, conversely, assumes a second, e.g. high, logic level when interrupt signals $I_1$ and $I_2$ are at different logic levels.

More specifically, logic circuit 26 may comprise an XOR gate or any similar circuit.

Processing unit 22, for example, is a microprocessor type, and comprises an output generating reset signal R to synchronize oscillation and the pulse count of the two pulse generating circuits 23 and 24; and an input receiving logic signal ST.

From the duration of a logic level of signal ST, processing unit 22 is able to determine the time difference $\Delta T$ between the times $T_1$ and $T_2$ taken by the two pulse generating circuits 23 and 24 of measuring device 20 to generate an equal number of pulses.

On the basis of time difference $\Delta T$, processing unit 22 is also able to determine the difference in capacitance $\Delta C$ between reference capacitive component 25 and capacitive component 21, and so calculate the capacitance of capacitive component 21 as a function of capacitance difference $\Delta C$ and reference capacitance $C_{REF}$.

The operating method of measuring device 20 will now be described with reference to FIG. 4, and assuming trigger thresholds $Th_1$ and $Th_2$ equal a number n of 256 pulses, and that reference capacitance $C_{REF}$ differs from the unknown capacitance being measured, and is such that frequency $f_2$ of reference pulses L generated by pulse generating circuit 24 substantially equals frequency $f_1$ of measuring pulses M generated by pulse generating circuit 23.

Firstly, processing unit 22 generates reset signal R, which, on the one hand, acts as a trigger to activate oscillation of multivibrator stages 23a and 24a, and, on the other, starts the pulse count by counter stages 23b and 24b.

More specifically, multivibrator stage 23a generates the pulse signal $B_1$ containing the train of measuring pulses M of frequency $f_1$, and, at the same time, multivibrator 24a generates the pulse signal $B_2$ containing reference pulses L of frequency $f_2$.

At this step, counter stages 23b and 24b count measuring pulses M and reference pulses L respectively.

When the measuring pulse M count reaches trigger threshold $Th_1$, counter stage 23b switches interrupt signal $I_1$ from the high to low logic level; and, at the same time, when the reference pulse L count reaches trigger threshold $Th_2$, counter stage 24b switches interrupt signal $I_2$ from the high to low logic level.

The unknown capacitance and the reference capacitance being different, interrupt signals $I_1$ and $I_2$ switch at different instants.

Figure 4:
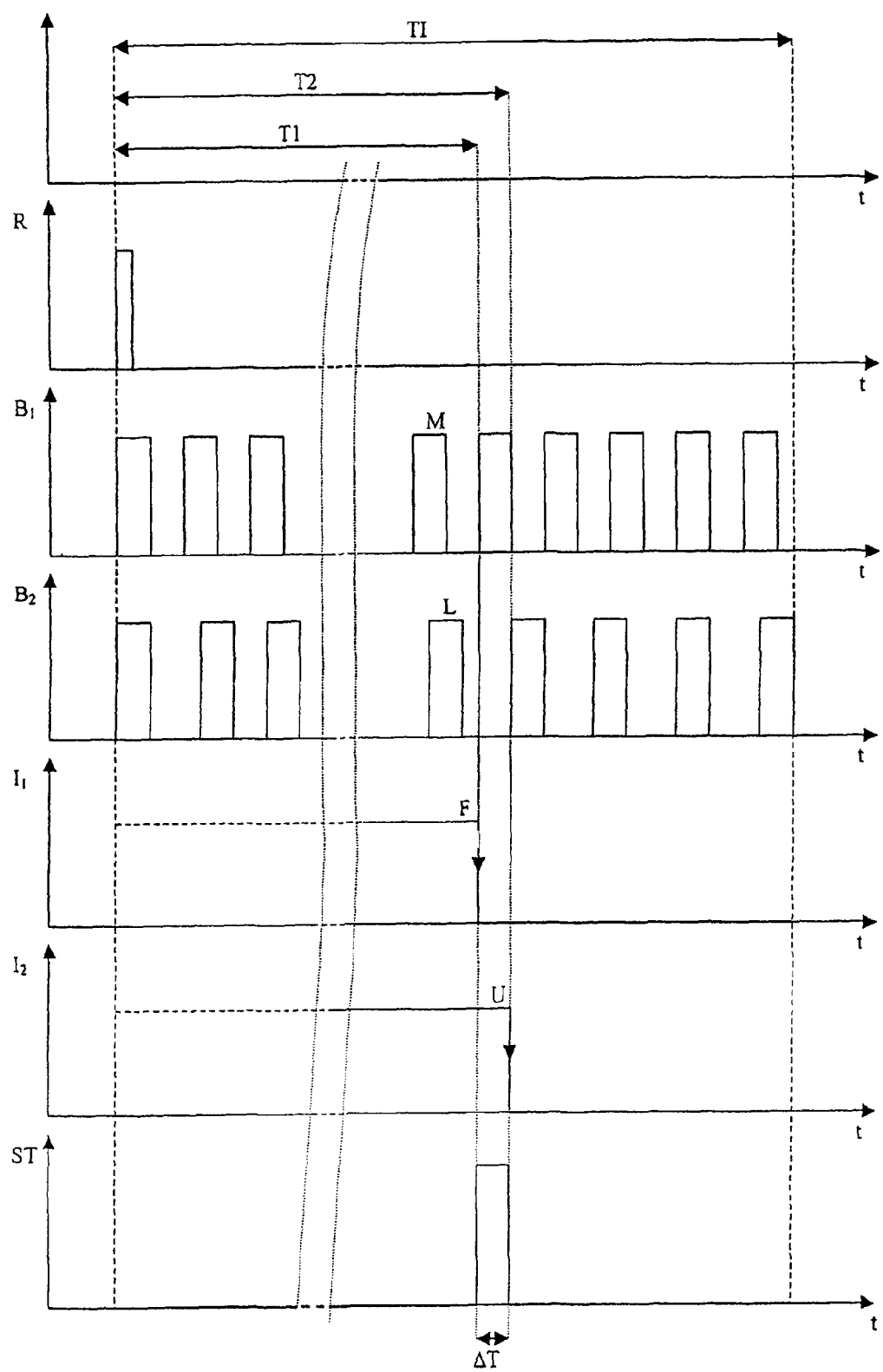
FIG. 4 shows a time graph of signals generated by the FIG. 3 capacitance measuring device.

More specifically, in the FIG. 4 example, interrupt signal $I_1$ switches before interrupt signal $I_2$. In the interval between the two switching, interrupt signals $I_1$ and $I_2$ are therefore at different logic levels, so logic circuit 26 switches signal ST from a low to high logic level throughout the time interval $\Delta T$ this condition persists, and which ends the instant interrupt signal $I_2$ switches.

Time interval $\Delta T$ therefore represents the difference between time T1 proportional to the unknown capacitance value, and time T2 proportional to the reference capacitance $C_{REF}$ value.

Signal ST therefore contains a square pulse of a duration corresponding to time interval $\Delta T$, and which is supplied to processing unit 22.

At this point, processing unit 22 determines the capacitance difference $\Delta C$ between reference capacitance $C_{REF}$ and the unknown capacitance being measured, as a function of time interval $\Delta T$ and according to the equation:

$$\Delta C = f(\Delta T) = \Delta T/(R^*K)$$

in which R is the resistance of a resistor in the Schmitt trigger; K is a constant.

At this point, processing unit 22 determines the unknown capacitance of capacitive component 21 on the basis of the reference capacitance $C_{REF}$ value and capacitance difference $\Delta C$.

With reference to FIG. 3, to make measuring device 20 particularly insensitive to external electromagnetic noise, a compensating electrode 45 can be connected to input terminal 36 of multivibrator stage 24a to supply multivibrator stage 24a with electromagnetic noise identical to that supplied to multivibrator stage 23a by measuring electrode 21a.

Any variations produced by external electromagnetic noise in interrupt signals $I_1$ and $I_2$ are thus identical, on account of the two pulse generating circuits 23, 24 having the same circuit configuration and receiving the same noise signals.

More specifically, being identical, noise-induced variations have absolutely no effect on the capacitance measurement, and, in fact, are reduced by logic circuit 26 determining the difference in the instants interrupt signals $I_1$ and $I_2$ switch.

It should also be pointed out that, for particularly effective noise compensation, multivibrator stage 24a must be defined by a circuit identical to the electronic circuit of multivibrator stage 23a, and, at the same time, counter stage 23b must be defined by a circuit identical to the electronic circuit of counter stage 24b.

In connection with the above, it should be pointed out that, in an embodiment not shown, measuring device 20 is connectable by a switching circuit (e.g. a multiplexer) to a number of capacitive components for measurement. By appropriately synchronizing switching of the switching circuit, measuring device 20 can therefore measure the capacitances of a large number of capacitive components 21.

Figure 5:
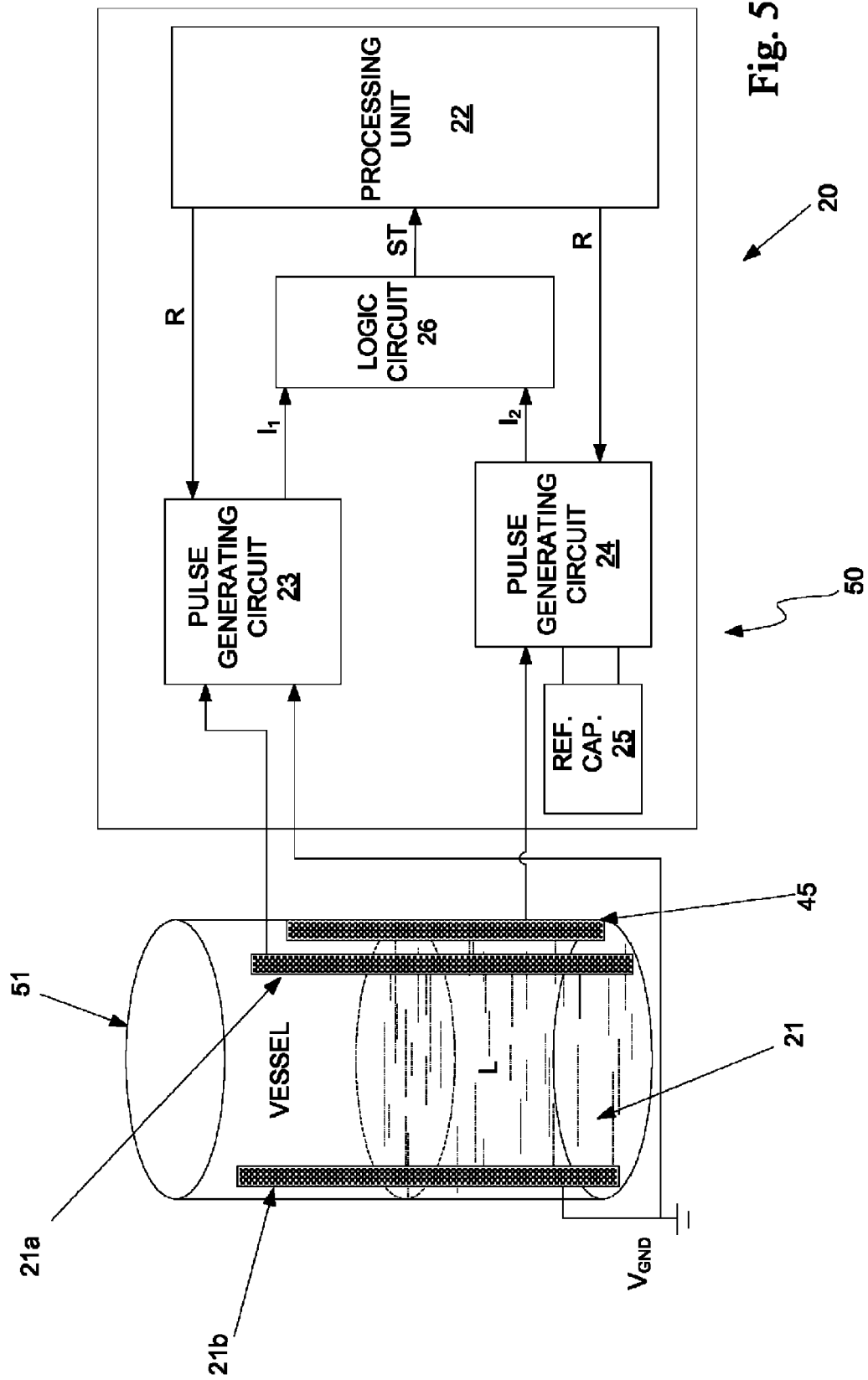
FIG. 5 shows, schematically, one possible application of the FIG. 3 measuring device in an apparatus for measuring the amount of liquid in a vessel.

FIG. 5 shows one possible application of measuring device 20, in an apparatus 50 for measuring the level of a liquid L in a vessel 51.

More specifically, in the FIG. 5 example, capacitive component 21 being measured has measuring electrode 21a and reference electrode 21b fitted to the inside or outside of vessel 51. For example, measuring electrode 21a and reference electrode 21b may be positioned facing each other and parallel to the inside or outside walls of vessel 51, and may be fitted to or incorporated in vessel 51.

Measuring apparatus 50 also preferably comprises compensating electrode 45, which is fitted to vessel 51, next to measuring electrode 21a, so as to receive the same noise signals and supply them to pulse generating circuit 24 to which it is connected.

A variation in the amount of liquid L in vessel 51 produces a corresponding variation in the capacitance of capacitive component 21, which is measured by measuring device 20; and processing unit 22 determines, as a function of the capacitance measurement, the corresponding amount of liquid L in vessel 51.

In addition to being straightforward and cheap to produce, measuring device 20 described above has the major advantage of accurately measuring both large and small variations in capacitance.

Moreover, using compensating electrode 45, measuring device 20 compensates for any input noise, particularly at the measuring electrode, and is therefore highly resistant to electromagnetic noise.

Clearly, changes may be made to the device and method as described herein without, however, departing from the scope of the present invention, as defined in the accompanying Claims.

The invention claimed is:

1. A measuring device (20) for measuring a capacitance of a capacitive component (21), comprising:
pulse generating means (23, 24), which are connected to the capacitive component (21) whose capacitance is being measured, to generate a first train of pulses (M) of a frequency ($f_1$) related to the unknown capacitance being measured, and are connected to a reference capacitive component (25) having a known reference capacitance ($C_{REF}$), to generate a second train of pulses (L) of a frequency ($f_2$) related to said reference capacitance ($C_{REF}$); and
processing means (22, 26) connected to said pulse generating means (23, 24) and configured to determine the time difference ($\Delta T$) between the times (T1, T2) taken by the first and second train of pulses (M, L) to reach a given number of pulses ($Th_1$, $Th_2$), and to calculate the difference ($\Delta C$) between the unknown capacitance and the reference capacitance ($C_{REF}$) as a function of said time difference ($\Delta T$).

2. A measuring device as claimed in claim 1, wherein said pulse generating means (23, 24) comprise:
first pulse generating means (23) connected to the capacitive component (21) whose capacitance is being measured, to generate a first interrupt signal ($I_1$) when the number of pulses in said first train of pulses (M) satisfies a given relationship with a first threshold ($Th_1$);
second pulse generating means (24) connected to said reference capacitive component (25) having said known reference capacitance ($C_{REF}$), to generate a second interrupt signal ($I_2$) when the number of pulses in said second train of pulses (L) satisfies a given relationship with a second threshold ($Th_2$);
said processing means (22, 26) receiving said first ($I_1$) and second ($I_2$) interrupt signal, and being configured to determine the time difference ($\Delta T$) corresponding to the time interval ($\Delta T$) between the instants in which the first ($I_1$) and second ($I_2$) interrupt signal are generated.

3. A measuring device as claimed in claim 2, wherein said first pulse generating means (23) comprise a multivibrator stage (23a) connected to said capacitive component (21) whose capacitance is being measured, to generate said first train of pulses (M), and a counter stage (23b) receiving the pulses (M) in the first train and generating said first interrupt signal ($I_1$); and in that said second pulse generating means (24) comprise a multivibrator stage (24a) connected to said reference capacitive component (25) to generate said second train of pulses (L), and a counter stage (24*b*) receiving said pulses (L) in the second train and generating said second interrupt signal ($I_2$).

4. A measuring device as claimed in claim 3, wherein said multivibrator stage (24*a*) of said second pulse generating means (24) comprises an electronic circuit similar to the electronic circuit of the multivibrator stage (23*a*) of said first pulse generating means (23).

5. A measuring device as claimed in claim 3 or 4, wherein said counter stage (24*b*) of said second pulse generating means (24) comprises an electronic circuit similar to the electronic circuit of the counter stage (23*b*) of said first pulse generating means (23).

6. A measuring device as claimed in claim 3, wherein said capacitive component (21) whose capacitance is being measured comprises a first and a second plate respectively defining a measuring electrode (21*a*) and a reference electrode (21*b*) of said measuring device (20); said multivibrator stage (23*a*) of the first pulse generating means (23) having a first and a second terminal connected respectively to said measuring electrode (21*a*) and said reference electrode (21*b*).

7. A measuring device as claimed in claim 3, wherein said multivibrator stage (24*a*) of the second pulse generating means (24) has two input terminals connected to two terminals of said reference capacitive component (25); said measuring device (20) comprising at least one compensating electrode (45) connected to one of the input terminals of said multivibrator stage (24*a*) of the second pulse generating means (24).

8. A measuring device as claimed in claim 7, characterized in that said compensating electrode (45) is located next to said measuring electrode (21*a*), so that the same noise is supplied to the second pulse generating means (24) and said first pulse generating means (23).

9. A measuring device as claimed in claim 2, wherein said processing means (22, 26) comprise a logic circuit (26) receiving said first ($I_1$) and second ($I_2$) interrupt signal to generate a logic signal (ST), which has a first logic level when said first ($I_1$) and second ($I_2$) interrupt signal are at the same logic level, and, conversely, has a second logic level when said first ($I_1$) and second ($I_2$) interrupt signal are at different logic levels.

10. A measuring device as claimed in claim 9, wherein said processing means (22, 26) comprise a processing unit (22) which receives and processes said logic signal (ST) to determine said time difference ($\Delta T$) and the corresponding difference in capacitance ($\Delta C$); said processing unit (22) also determining the unknown capacitance of the capacitive component (21) being measured, as a function of said difference in capacitance ($\Delta C$) and said reference capacitance ($C_{REF}$).

11. A measuring apparatus (50) for measuring the amount of liquid in a vessel (51), comprising a measuring device (20) as claimed in any one of the foregoing claims, and wherein said capacitive S component (21) whose capacitance is being measured comprises a first and a second plate respectively defining a measuring electrode (21*a*) and a reference electrode (21*b*) of said measuring device, which are fitted to the vessel (51) to define, with the liquid in the vessel (51), a capacitor whose capacitance varies as a function of the amount of the liquid in said vessel (51); said processing means (26) of said measuring device (20) determining the amount of liquid in the vessel (51) as a function of the measured capacitance of the capacitive component (21).

12. A measuring apparatus (50) as claimed in claim 11, wherein said measuring electrode (21*a*) and said reference electrode (21*b*) are fitted to or incorporated in said vessel (51).

13. A method of measuring a capacitance of a capacitive component (21), comprising:
a) connecting said capacitive component (21), whose capacitance is being measured, to pulse generating means (23, 24) to generate a first train of pulses (M) having a frequency ($f_1$) related to the unknown capacitance being measured;
b) connecting a reference capacitive component (25), having a known reference capacitance ($C_{REF}$), to said pulse generating means (23, 24) to generate a second train of pulses (L) having a frequency ($f_2$) related to said reference capacitance ($C_{REF}$);
c) connecting said pulse generating means (23, 24) to processing means (22, 26) to determine the time difference ($\Delta T$) between the times (T1, T2) taken by the first and second train of pulses (M, L) to reach a given number of pulses ($Th_1$, $Th_2$); and
d) calculating, by means of said processing means (22, 26), the difference in capacitance ($\Delta C$) between the unknown capacitance of the capacitive component (21) and the reference capacitance ($C_{REF}$) as a function of said time difference ($\Delta T$).

14. A method as claimed in claim 13, wherein:
said step a) comprises the step of connecting said capacitive component (21) to first pulse generating means (23) to generate a first interrupt signal ($I_1$) when the number of pulses in said first train of pulses (M) satisfies a given relationship with a first threshold ($Th_1$);
said step b) comprises the step of connecting said reference capacitive component (25) to second pulse generating means (24) to generate a second interrupt signal ($I_2$) when the number of pulses in said second train of pulses (L) satisfies a given relationship with a second threshold ($Th_2$);
said step c) comprises the step of calculating the time difference ($\Delta T$) between the instants in which the first ($I_1$) and second ($I_2$) interrupt signal are generated.

15. A method as claimed in claim 14, wherein said first pulse generating means (23) comprise a multivibrator stage (23*a*) connected to said capacitive component (21) whose capacitance is being measured, to generate said first train of pulses (M), and a counter stage (23*b*) receiving the pulses (M) in the first train and generating said first interrupt signal ($I_1$); and in that said second pulse generating means (24) comprise a multivibrator stage (24*a*) connected to said reference capacitive component (25) to generate said second train of pulses (L), and a counter stage (24*b*) receiving said pulses (L) in the second train and generating said second interrupt signal ($I_2$).

16. A method as claimed in claim 15, further comprising the step of providing a multivibrator stage (24*a*) of said second pulse generating means (24) having an electronic circuit similar to the electronic circuit of the multivibrator stage (23*a*) of said first pulse generating means (23).

17. A method as claimed in claim 15 or 16, further comprising providing a counter stage (24*b*) of said second pulse generating means (24) having an electronic circuit similar to the electronic circuit of the counter stage (23*b*) of said first pulse generating means (23).

18. A method as claimed in claim 15, wherein said capacitive component (21) whose capacitance is being measured comprises a first and a second plate respectively defining a measuring electrode (21*a*) and a reference electrode (21*b*) of said measuring device (20); said step a) comprising the step of connecting a first and second terminal of said multivibrator stage (23*a*) of the first pulse generating means (23) to said measuring electrode (21*a*) and said reference electrode (21*b*) respectively.

19. A method as claimed in claim 18, wherein said multivibrator stage (24*a*) of the second pulse generating means (24) has two input terminals connected to two terminals of said reference capacitive component (25); said step b) comprising the step of connecting at least one compensating electrode (45) to one of the input terminals of said multivibrator stage (24*a*) of the second pulse generating means (24).

20. A method as claimed in claim 19, further comprising the step of positioning said compensating electrode (45) next to said measuring electrode (21*a*), so that the same noise is supplied to the first (23) and second (24) pulse generating means.

* * * * *